(12) United States Patent
Camacho et al.

(10) Patent No.: US 7,919,360 B1
(45) Date of Patent: Apr. 5, 2011

(54) INTEGRATED CIRCUIT PACKAGING SYSTEM WITH CIRCUITRY STACKING AND METHOD OF MANUFACTURE THEREOF

(75) Inventors: Zigmund Ramirez Camacho, Singapore (SG); Jose Alvin Caparas, Singapore (SG); Arnel Senosa Trasporto, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/562,722

(22) Filed: Sep. 18, 2009

(51) Int. Cl.
*H01L 21/00* (2006.01)
*H01L 23/495* (2006.01)
*H01L 23/48* (2006.01)
*H01L 23/28* (2006.01)

(52) U.S. Cl. ........ 438/123; 438/124; 257/676; 257/735; 257/787

(58) Field of Classification Search .................. None
See application file for complete search history.

(56) References Cited

U.S. PATENT DOCUMENTS

| | | | |
|---|---|---|---|
| 6,087,718 A * | 7/2000 | Cho | 257/686 |
| 6,483,181 B2 * | 11/2002 | Chang et al. | 257/686 |
| 6,559,526 B2 | 5/2003 | Lee et al. | |
| 6,744,121 B2 * | 6/2004 | Chang et al. | 257/668 |
| 7,023,076 B2 | 4/2006 | Khiang | |
| 7,193,298 B2 | 3/2007 | Hong et al. | |
| 7,202,554 B1 | 4/2007 | Kim et al. | |
| 7,435,619 B2 | 10/2008 | Shim et al. | |
| 2007/0181990 A1 | 8/2007 | Huang et al. | |
| 2007/0252284 A1 | 11/2007 | Su et al. | |
| 2008/0036051 A1 | 2/2008 | Espiritu et al. | |
| 2010/0025834 A1 | 2/2010 | Camacho et al. | |

* cited by examiner

*Primary Examiner* — Scott B Geyer
(74) *Attorney, Agent, or Firm* — Mikio Ishimaru

(57) ABSTRACT

A method of manufacture of an integrated circuit packaging system includes: forming a lead to include a first tip at one end, a second tip on the end opposite from the first tip with a connect area between each end located above the first tip, and a first tier section or a second tier section located between the connect area and the second tip; connecting a bottom component assembly to the first tier section or the second tier section; connecting a top component assembly over the connect area; and applying an encapsulant over and under the connect area with the first tip exposed.

17 Claims, 7 Drawing Sheets

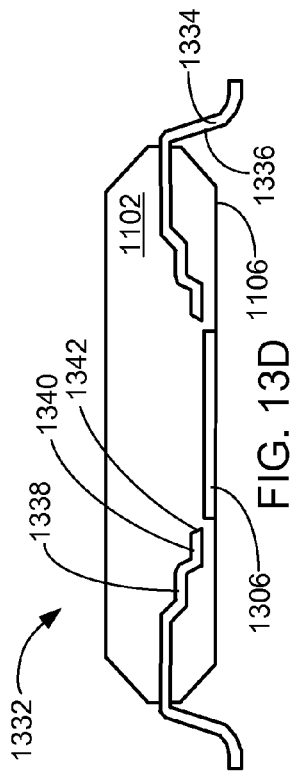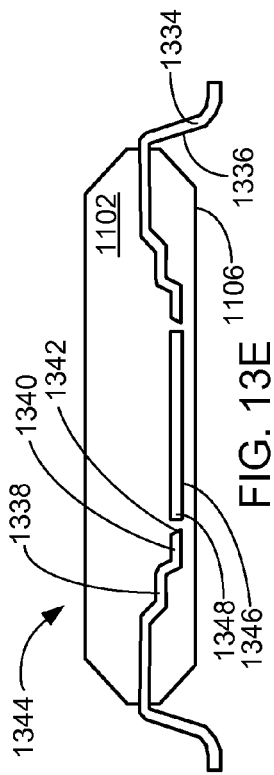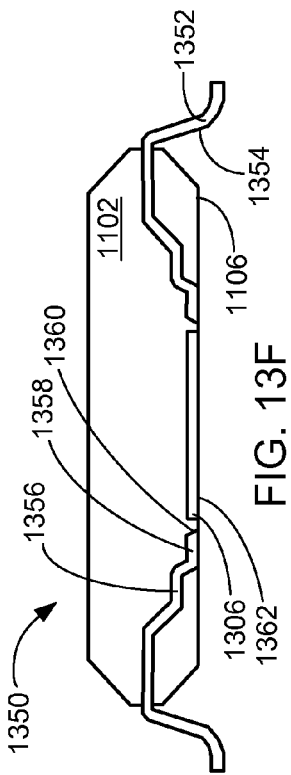
FIG. 13A  FIG. 13B  FIG. 13C
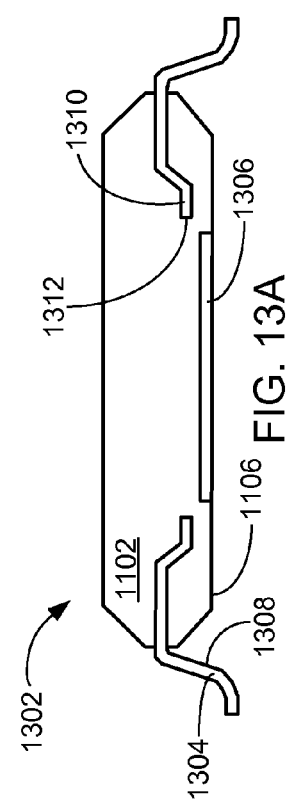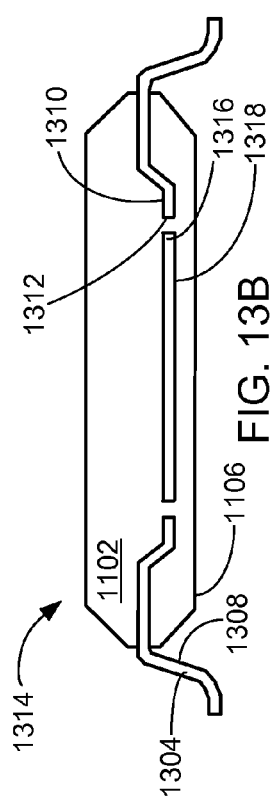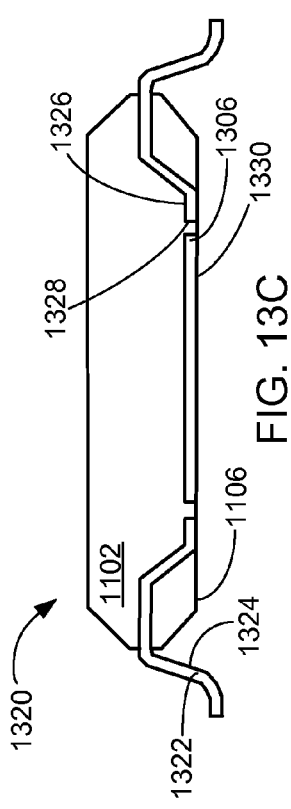
FIG. 13D  FIG. 13E  FIG. 13F

INTEGRATED CIRCUIT PACKAGING SYSTEM WITH CIRCUITRY STACKING AND METHOD OF MANUFACTURE THEREOF

CROSS-REFERENCE TO RELATED APPLICATION(S)

The present application contains subject matter related to co-pending U.S. patent application Ser. No. 12/185,061 filed Aug. 1, 2008. The related application is assigned to STATS ChipPAC Ltd.

TECHNICAL FIELD

The present invention relates generally to an integrated circuit packaging system, and more particularly to a package system for stacked circuitry.

BACKGROUND ART

The integrated circuit package is the building block used in a high performance electronic system to provide applications for usage in products such as wireless communications equipment, military devices, industrial robotics, spacecraft, and a vast line of high performance products from consumer to state-of-the art high performance applications. The integrated circuit such as a chip or die contains circuitry designed to function in a high performance electronic system.

The integrated circuit package can include a package base or package substrate providing a mounting structure for attachment of at least one chip or die and an enclosure such as an epoxy applied on it to protect its contents. The circuitry within a package commonly consists of integrated circuits built onto one side, such as the top, of a piece of semiconductor material such as silicon chip or die. Typically, one side of the chip or die is used primarily for the mounting the chip or die.

The other side of the chip or die, referred to as an active surface of the chip or die, has electrically conductive areas that provide for electrical connections to its circuitry. Connectors, consisting of electrically conductive material, attach to the conductive areas to provide electrical connection between the circuitry of the chip or die and other circuitry not of the same chip or die. The connectors also provide connections between leads, such as electrically conductive material, which are used to provide connections between the circuitry within the package and the printed circuit board outside the package within the electronic system.

The demand for multiple chip or die assemblies contained within a single integrated circuit package continues to grow worldwide. Typically, multiple chip or die are assembled over or next to one another within a single package to maximize circuitry while minimizing the physical size of the integrated circuit package. A die paddle, such as a conductive platform, is often attached below all of the circuitry to assist in production or performance of the resulting packaged circuitry within the integrated circuit package.

Integrated circuit packages having small footprints with multiple high performance circuitries require that the length of the connectors connecting the circuitry with the leads be as small as possible. This is accomplished by designing each of the leads to be as close as possible to targeted connection areas of the circuitry.

A solution used to minimize the distance between the leads and the circuitry is to locate the leads centrally within the integrated circuit package. Multiple die or chips can be mounted above, next to, and below the leads. The problem with this approach is that the die or chip located furthest above or below the leads continue to have long distances between the leads and the circuitry of the die or chip when compared to the circuitry located close to the centrally located leads.

Yet another possible solution used to minimize the distance between the leads and the circuitry is to modify the leads to include downset extensions. The downset extensions are created by extending the length of the leads and directing the downset extensions towards the lower half of the integrated circuit package. Multiple die or chips can be mounted on or below the downset extensions to minimize the distance between the leads and the circuitry.

Since the die or chips are located on or below the downset extensions, the die or chips are restricted to the lower half of the integrated circuit package limiting the amount of die or chip circuitry that can be contained within the integrated circuit package.

Attempts have failed to provide a complete solution addressing simplified manufacturing processing, high performance circuitry, smaller dimensions, lower costs due to design flexibility, reduced package counts, increased functionality, leveragability, and increased IO connectivity capabilities.

In view of the ever-increasing commercial competitive pressures, along with growing consumer expectations and the diminishing opportunities for meaningful product differentiation in the marketplace, it is critical that answers be found for these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a lead to include a first tip at one end, a second tip on the end opposite from the first tip with a connect area between each end located above the first tip, and a first tier section or a second tier section located between the connect area and the second tip; connecting a bottom component assembly to the first tier section or the second tier section; connecting a top component assembly over the connect area; and applying an encapsulant over and under the connect area with the first tip exposed.

The present invention provides an integrated circuit packaging system including: a lead formed to include a first tip at one end, a second tip on the end opposite from the first tip with a connect area between each end located above the first tip, and a first tier section or a second tier section located between the connect area and the second tip; a bottom component assembly connected to the first tier section or the second tier section; a top component assembly connected over the connect area; and an encapsulant applied over and under the connect area with the first tip exposed.

Certain embodiments of the invention have other aspects in addition to or in place of those mentioned above. The aspects will become apparent to those skilled in the art from a reading of the following detailed description when taken with reference to the accompanying drawings.

BRIEF DESCRIPTION OF THE DRAWINGS

FIGS. 13A, 13B, 13C, 13D, 13E, and 13F are cross-sectional plan views of lead and paddle configuration options in an encapsulation phase of integrated circuit packaging systems in an eleventh, twelfth, thirteenth, fourteenth, fifteenth, and sixteenth embodiment of the present invention.

BEST MODE FOR CARRYING OUT THE INVENTION

Figure 1:
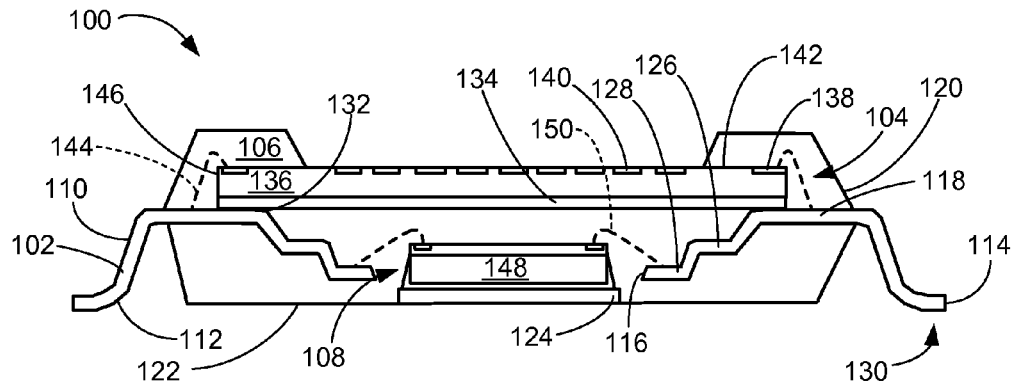
FIG. 1 is a cross-sectional view of an integrated circuit packaging system in a first embodiment of the present invention taken along a line 1-1 of FIG. 2.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "side" (as in "sidewall"), "higher", "lower", "upper", "over", and "under", are defined with respect to the horizontal plane.

The term "horizontal axis" as used herein is defined as a plane bisecting a cross-sectional view and parallel to a side having the greatest surface area of the present invention that is perpendicular to the plane of the cross-sectional view. The terms "bottom" and "top" are defined with respect to the horizontal axis plane. The term "on" means that there is direct contact among elements.

The term "processing" as used herein includes deposition of material or photoresist, patterning, exposure, development, etching, cleaning, and/or removal of the material or photoresist as required in forming a described structure.

Figure 2:
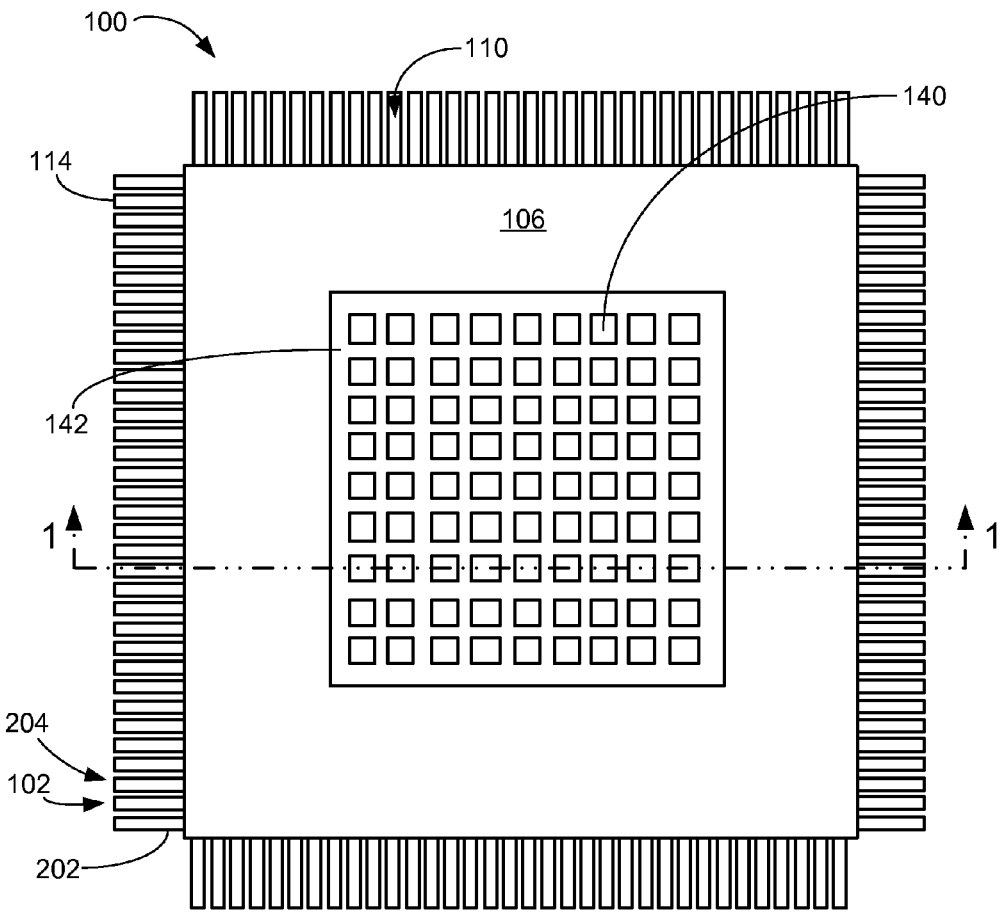
FIG. 2 is a top view of the integrated circuit packaging system.

Referring now to FIG. 1, therein is shown a cross-sectional view of an integrated circuit packaging system 100 in a first embodiment of the present invention taken along a line 1-1 of FIG. 2.

The integrated circuit packaging system 100 can preferably include leads 102 and a top component assembly 104 such as a dual row quad flat no lead package, a ball grid array package, a land grid array package, a flip-chip package, a wafer level chip size package, a known good package, an interposer, or any combination thereof. The integrated circuit packaging system 100 also can preferably include an encapsulant 106 and a bottom component assembly 108 such as a quad flat no lead package, a dual row quad flat no lead package, an inverted package, an integrated circuit device, a known good package, a flip chip, or a stacked combination thereof.

Each of the leads 102 have conductive properties and can include a first surface 110 and a second surface 112. The first surface 110 can be used provide electrical connectivity or mechanical structural support with the top component assembly 104 or the bottom component assembly 108. The second surface 112 can be used provide electrical connectivity or mechanical structural support between the integrated circuit packaging system 100 and a next level of system integration such as a printed circuit board.

Each of the leads 102 can preferably include a first tip 114 on one end, a second tip 116 on the opposite end, and a connect area 118 located above and between the first tip 114 and the second tip 116. The second tip 116 can be formed with either a perpendicular or a tapered angled end relative to the first surface 110, the second surface 112, or side surfaces 202 of FIG. 2 of the leads 102.

The leads 102 are positioned with the second tip 116 within the encapsulant 106 and the first tip 114 outside the encapsulant 106. The encapsulant 106 can cover the second surface 112 of the leads 102 below the connect area 118 to the second tip 116. The first tip 114 of the leads 102 can preferably be oriented to protrude away from sides 120 of the encapsulant 106. The first tip 114 of each of the leads 102 can be bent and located within a plane parallel to a plane having a bottom encapsulant surface 122 of the encapsulant 106. The end having the first tip 114 is the lowest point of the leads 102.

The second tip 116 of each of the leads 102 can be bent and located adjacent to a perimeter of the bottom component assembly 108, of the top component assembly 104, or of a bottom die paddle 124 with the leads 102 projecting outwardly away from the perimeter. The connect area 118 is the highest area of each of the leads 102 and is located in a plane above and parallel to the plane having the bottom encapsulant surface 122. The first surface 110 of the connect area 118 of each of the leads 102 can be used for connecting or mounting of the top component assembly 104.

The leads 102 can preferably be formed to include a first tier section 126 or a second tier section 128. The second tier section 128 can be next to the second tip 116 and below the first tier section 126. The second tier section 128 of each of the leads 102 can be located in a plane between and parallel with the plane having the bottom encapsulant surface 122 and the plane having the connect area 118. The first surface 110 of the second tier section 128 can be used for connecting or mounting of the bottom component assembly 108.

The first tier section 126 can be located below the connect area 118 in a plane between and parallel with the plane having the second tier section 128 and the plane having the connect area 118. The first surface 110 of the first tier section 126 can be used for connecting or mounting of the top component assembly 104 as well as for connecting with the bottom component assembly 108. The first tier section 126, the second tier section 128, and a portion of the connect area 118 are located within the encapsulant 106.

The remaining portion of each of the leads 102 between the connect area 118 exposed from the encapsulant 106 and the first tip 114 can be angled downward near the sides 120 of the encapsulant 106. The leads 102 can formed to include a contact area 130 on the second surface 112 next to the first tip 114 to provide connectivity between each of the leads 102 and a next level of system integration such as a printed circuit board.

For illustrative purposes and discussion, the leads 102 have been formed with the first tier section 126 and the second tier section 128. The present invention is non-limiting and non-restrictive in regards to quantity or formation of tiered sections. The quantity or formation of the tiered sections can be modified to meet user specific application requirements.

A beveled edge 132 can be formed on the first surface 110 next to an end of the connect area 118 closest to the second tip 116 or on the first surface 110 next to an end of the first tier section 126 closest to the second tip 116. The beveled edge 132 can be shaped having a downward tapered angle on the leads 102. The beveled edge 132 can be used to improve the mounting of circuitry using an attachment layer 134 such as a backside coated adhesive, a laminated B-stage an epoxy material, or a similar mounting material by providing an area for material seepage of the attachment layer 134.

The top component assembly 104 can be mounted over the connect area 118. The top component assembly 104 can preferably include a laminated interposer 136 having edge pads 138 and contacts 140 exposed adjacent a contact surface 142 on one side and having an opposite side covered with the attachment layer 134 mounting the top component assembly 104 with the first surface 110 of the connect area 118. The connect area 118 of the leads 102 can provide a simple structure for the mounting of the laminated interposer 136 using known methods such as the attachment layer 134.

The edge pads 138 can be located next to side edges 146 of the laminated interposer 136. The contacts 140 can preferably be located centrally and away from the edge pads 138 of the laminated interposer 136. The laminated interposer 136 includes conductive material that provides connectivity between the edge pads 138 and the contacts 140. Bond wires 144 can be used to provide connectivity between the edge pads 138 and the first surface 110 of the connect area 118 next to the top component assembly 104.

The encapsulant 106 can be applied over the connect area 118, the bond wires 144, and the edge pads 138. The contacts 140 and the contact surface 142 adjacent the contacts 140 can be substantially exposed from the encapsulant 106. The encapsulant 106 can be applied under the connect area 118 and surround the bottom die paddle 124 with the bottom die paddle 124 exposed adjacent the bottom encapsulant surface 122.

The contacts 140 can preferably be used to provide connectivity between the integrated circuit packaging system 100 and a next level subsystem connecting with the contact area 130 of the integrated circuit packaging system 100, or at least one component such as a package, discrete electronic parts, switches, or any combination of similar parts typically accompanying circuitry. The integrated circuit packaging system 100 can provide a leaded package with top ports for package on package (POP) applications or three-dimensional packaging capabilities.

It has been discovered that the top component assembly 104 mounted over the connect area 118, unrestricted by the leads 102, can be substantially larger in size without a change in the size of the integrated circuit packaging system 100 while providing optimum connectivity within and between the integrated circuit packaging system 100 and the next level of integration.

It has been found that the contacts 140 can be used to program or provide firmware changes to non-volatile storage memory (NVM) circuitry resident as well as used to test and diagnose the integrated circuit packaging system 100 during pre-production or post-production product environments providing substantial improvements in product quality or customer support.

The bottom component assembly 108 can preferably include a device 148 containing circuitry. The bottom component assembly 108 can be mounted on to the bottom die paddle 124 of conductive or non-conductive material surrounded by the second tip 116 of each of the leads 102. Base interconnects 150 such as solder puddles, solder balls, reverse standoff stitch bonding wires, or bond wires can be used to provide connectivity between the device 148 and the first surface 110 of the second tier section 128 of the leads 102.

A side of the bottom die paddle 124 opposite the side with the device 148 of the bottom component assembly 108 can be exposed adjacent the bottom encapsulant surface 122.

Referring now to FIG. 2, therein is shown a top view of the integrated circuit packaging system 100. The first tip 114 and portions of the first surface 110 of each of the leads 102 are shown exposed and extending perpendicularly away from the encapsulant 106 and non-tiered leads 204. The non-tiered leads 204 can preferably include the contact area 130 on the second surface 112 next to the first tip 114 on one end and a connect area 302 of FIG. 3 with a second tip 304 of FIG. 3 on the opposite end. The connect area 302 can be used for connecting or mounting of the laminated interposer 136 of FIG. 1. The contact area 130 of the leads 102 and of the non-tiered leads 204 can be located within a plane parallel to the plane containing the bottom encapsulant surface 122 of FIG. 1.

The contacts 140 and the contact surface 142 of the laminated interposer 136 of FIG. 1 are also shown surrounded by the encapsulant 106. The contacts 140 can be individually rectangular shaped and arranged in a rectangular grid arrangement. The contacts 140 can be used to provide connectivity with active or passive components such as packages, package stacks, optical displays, integrated circuit module sockets, surface mount switches, or any variety of similar components that can be connected and mounted above the integrated circuit packaging system 100.

The shape, size, and arrangement of the contacts 140 are non-restrictive or non-limiting for the present invention.

It has been discovered that the contacts 140 with the leads 102 can be used to extensively test and screen for known good units (KGU) of the integrated circuit packaging system 100.

Thus, it has been discovered that the integrated circuit packaging system 100 of the present invention furnishes important and heretofore unknown and unavailable solutions, capabilities, and functional aspects for package on package products.

Figure 3:
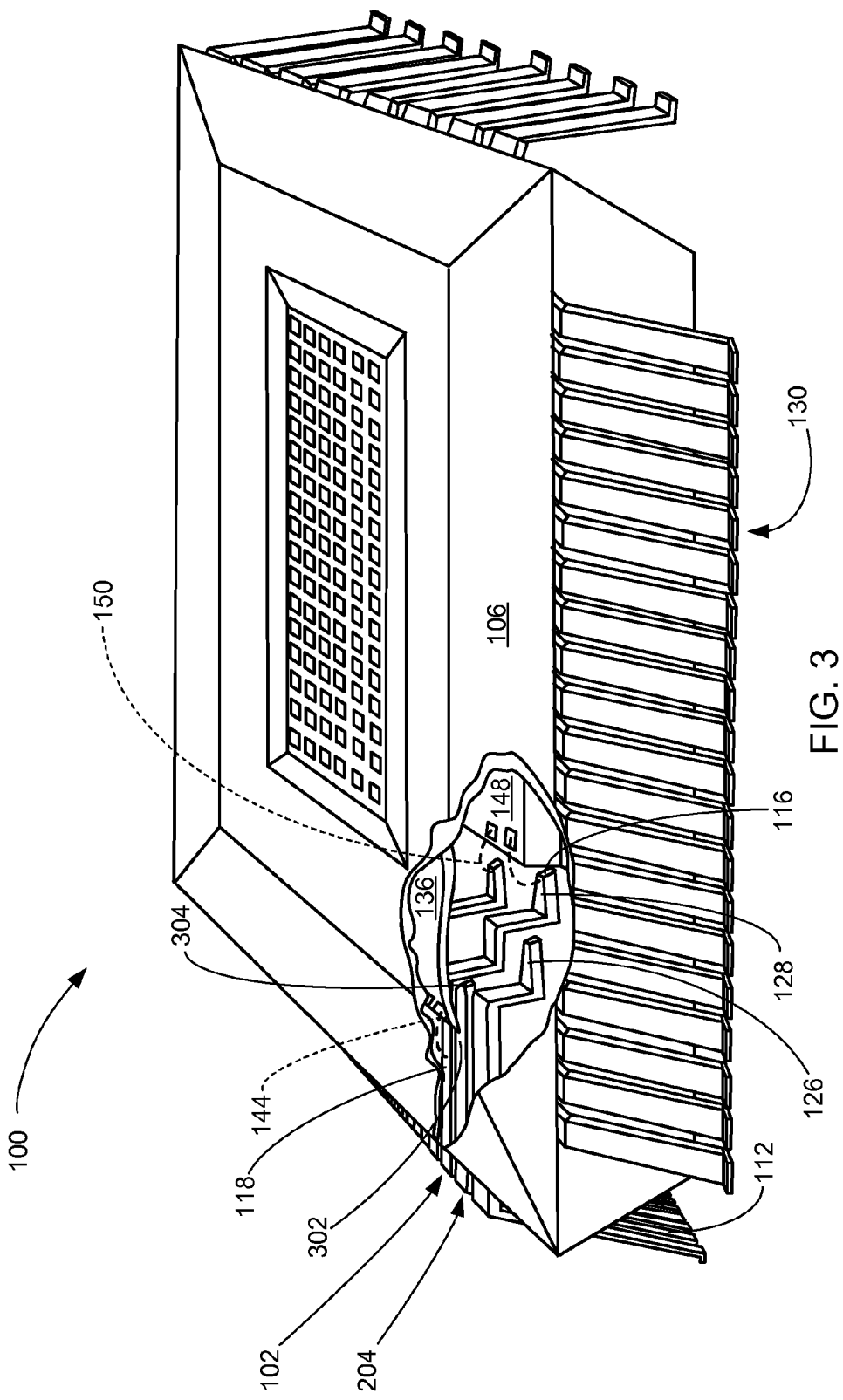
FIG. 3 is a top isometric view of the integrated circuit packaging system.

Referring now to FIG. 3, therein is shown a top isometric view of the integrated circuit packaging system 100. Portions of the encapsulant 106 and the laminated interposer 136 have been removed for illustrative purposes and clarity. Shown are the leads 102 and the non-tiered leads 204. The leads 102 can be formed either with the first tier section 126 only or with both the first tier section 126 and the second tier section 128 next to the second tip 116. The non-tiered leads 204 are formed having the connect area 302 next to the second tip 304.

The connect area 302 of the non-tiered leads 204 and the connect area 118 of the leads 102 all reside within a plane parallel and above the plane having the bottom encapsulant surface 122 of FIG. 1. The laminated interposer 136 is shown mounted over the connect area 302 and the connect area 118. The connect area 118 of the leads 102 and the connect area 302 of the non-tiered leads 204 reside in a plane parallel to the plane having the bottom encapsulant surface 122 of FIG. 1. One of the bond wires 144 is shown connecting the laminated interposer 136 with the connect area 118 of the leads 102. Also shown is one of the base interconnects 150 connecting circuitry of the device 148 with the second tier section 128 of the leads 102.

It has been discovered that the use of the non-tiered leads 204 or the leads 102 with multiple tiered sections can provide substantial improvement in quantity of circuitry, reduced wire lengths, wire routing, and production costs by using proven lead based package techniques within a three dimensional leaded packaging application.

Figure 4:
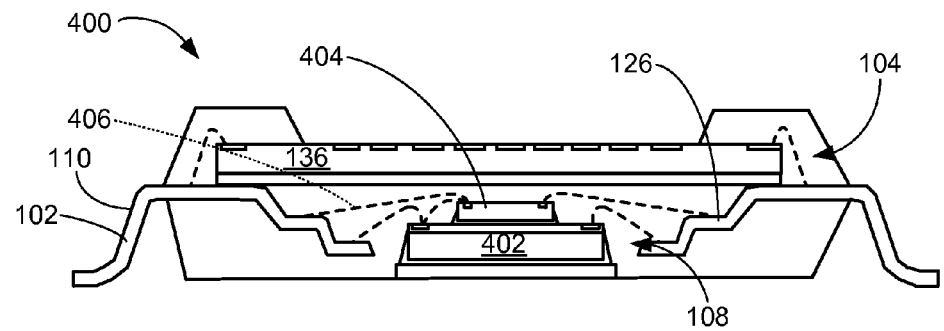
FIG. 4 is a cross-sectional view of an integrated circuit packaging system in a second embodiment of the present invention.

Referring now to FIG. 4, therein is shown a cross-sectional view of an integrated circuit packaging system 400 in a second embodiment of the present invention. The integrated circuit packaging system 400 is similar to the integrated circuit packaging system 100 of FIG. 1 except the bottom component assembly 108 includes a device 402, such as the device 148 and a first stack device 404 containing circuitry. The first stack device 404 can preferably be stacked over the bottom component assembly 108 having the device 402. The bottom component assembly 108 can be mounted over the bottom die paddle 124.

The first stack device 404 can preferably have physical dimensions smaller than the physical dimensions of the bottom component assembly 108 and located between the bottom component assembly 108 and the laminated interposer 136 of the top component assembly 104. Bond wires 406 can provide connectivity between the first stack device 404 and the first surface 110 of the first tier section 126 of the leads 102. The bond wires 406 can also be used to provide direct connectivity between the bottom component assembly 108 and the first stack device 404 resulting in minimum signal propagation delays between the device 402 and the first stack device 404.

Figure 5:
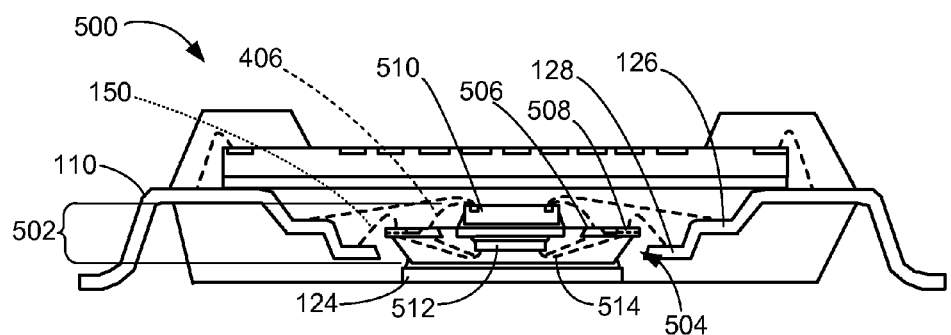
FIG. 5 is a cross-sectional view of an integrated circuit packaging system in a third embodiment of the present invention.

Referring now to FIG. 5, therein is shown a cross-sectional view of an integrated circuit packaging system 500 in a third embodiment of the present invention. The integrated circuit packaging system 500 is similar to the integrated circuit packaging system 100 of FIG. 1 except a bottom component assembly 502 can include an inverted package 504 such as a dual row contact quad flat no lead package mounted over the bottom die paddle 124.

The inverted package 504 having contacts 506 and outer contacts 508 located along a perimeter of a side facing away from the bottom die paddle 124. A stack device 510 with smaller physical dimensions than the physical dimensions of the inverted package 504 can be mounted over the inverted package 502. The contacts 506 and the outer contacts 508 of the inverted package 502 can be substantially exposed around the stack device 510.

The outer contacts 508 of the inverted package 504 can be connected to the first surface 110 of the second tier section 128 using the base interconnects 150. The bond wires 406 can be used to connect circuitry of the stack device 510 with the contacts 506 of the inverted package 504 or with the first surface 110 of the first tier section 128. The inverted package 504 can include internal circuitry 512 having internal bond wires 514 providing connectivity to the contacts 506 or the outer contacts 508 within the inverted package 504.

Figure 6:
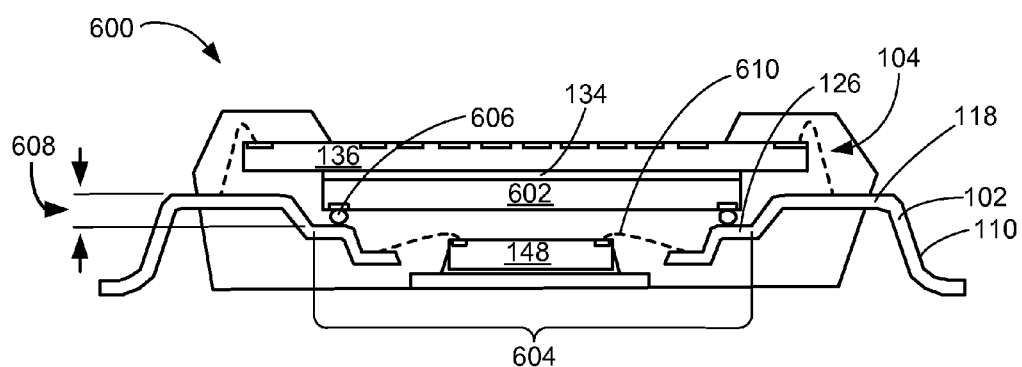
FIG. 6 is a cross-sectional view of an integrated circuit packaging system in a fourth embodiment of the present invention.

Referring now to FIG. 6, therein is shown a cross-sectional view of an integrated circuit packaging system 600 in a fourth embodiment of the present invention. The integrated circuit packaging system 600 is similar to the integrated circuit packaging 100 of FIG. 1 except the top component assembly 104 is mounted over and supported by a central device 602 such as a known good package, a flip chip, a wafer level chip size package, or a similar packaged unit having circuitry using the attachment layer 134.

The central device 602 can have a dimensional length and width substantially less than the dimensional length and width of the top component assembly 104. The central device 602 can have a smaller surface area than a perimeter area 604 formed by an area contained and bounded by the first surface 110 of the first tier section 126 of each of the leads 102. The central device 602 can be connected with the first surface 110 of the first tier section 126 using central interconnects 606 such as solder balls, solder puddles, or similar connection technology. The attachment layer 134 can be applied on to the central device 602 resulting in portions of the laminated interposer 136 of the top component assembly 104 to be exposed of any of the attachment layer 134.

The cumulative numeric dimensional thickness of the attachment layer 134, central device 602, and the central interconnects 606 can preferably be greater than a measured distance 608 to provide physical separation between the connect area 118 of the leads 102 and the laminated interposer 136 of the top component assembly 104. The measured distance 608 is defined as the vertical height from the first surface 110 of the first tier section 126 to the first surface 110 of the connect area 118.

Low profile bond wires 610 can preferably connect circuitry of the device 148 with the first surface 110 of the second tier section 128. The low profile bond wires 610, such as a reverse standoff stitch bonding wire or similar low Z-height connection technology, can minimize overall height and maximize circuitry of the integrated circuit packaging system 600.

Figure 7:
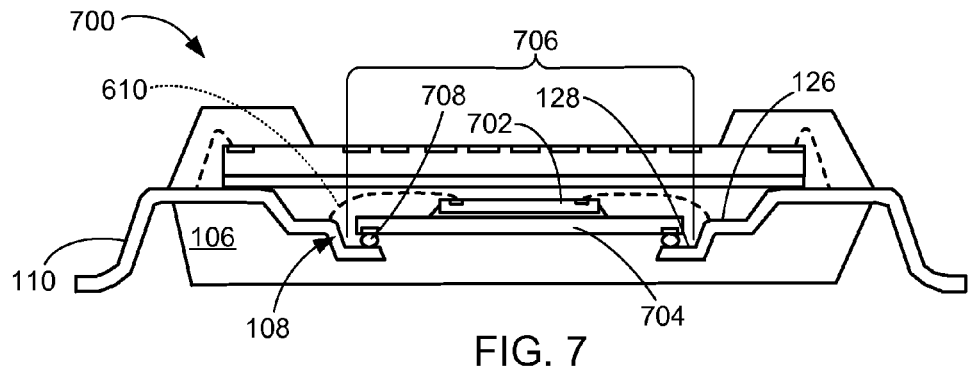
FIG. 7 is a cross-sectional view of an integrated circuit packaging system in a fifth embodiment of the present invention.

Referring now to FIG. 7, therein is shown a cross-sectional view of an integrated circuit packaging system 700 in a fifth embodiment of the present invention. The integrated circuit packaging system 700 is similar to the integrated circuit packaging system 100 of FIG. 1 except the bottom component assembly 108 can preferably include a first thin package 702 mounted over a second thin package 704. The bottom component assembly 108 can be mounted on to the first surface 110 of the second tier section 128 using base interconnects 708 such as solder puddles, solder balls, reverse standoff stitch bonding wires, or bond wires.

The first thin package 702 can preferably have smaller physical dimensions than the physical dimensions of the second thin package 704. The second thin package 704 can have a smaller surface area than a perimeter area 706 formed by an area contained and bounded by the first surface 110 of the second tier section 128 of each of the leads 102.

The low profile bond wires 610 can be used to provide connectivity between the first thin package 702 and the first surface 110 of the first tier section 126.

Figure 8:
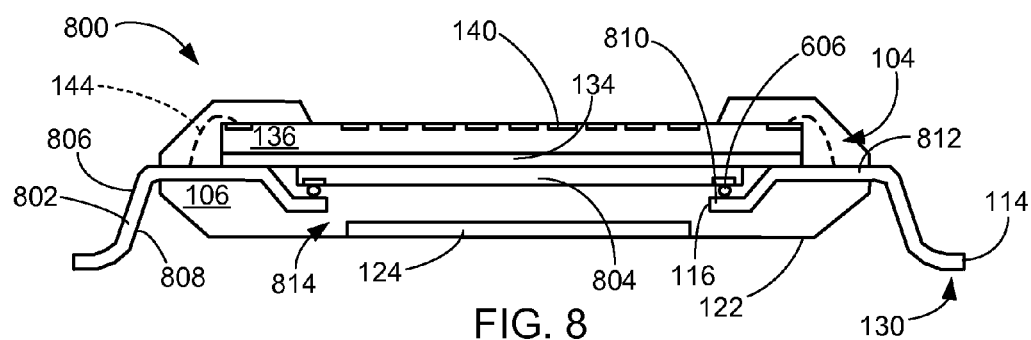
FIG. 8 is a cross-sectional view of an integrated circuit packaging system in a sixth embodiment of the present invention.

Referring now to FIG. 8 therein is shown a cross-sectional view of an integrated circuit packaging system 800 in a sixth embodiment of the present invention. The integrated circuit packaging system 800 can preferably include leads 802, a bottom component assembly 804, and the top component assembly 104 having one side covered with the attachment layer 134. The leads 802 can preferably include a first surface 806 and a second surface 808. The leads 802 can be formed having the first tip 114 on one end, the second tip 116 on the end opposite the end with the first tip, and a first tier section 810 next to the second tip 116 located below a connect area 812.

The connect area 812 is the highest area of each of the leads 802 and is located in a plane above and parallel to the plane having the bottom encapsulant surface 122. The first surface 806 of the connect area 812 of each of the leads 802 can be used for connecting or mounting of the top component assembly 104. The first tip 114 of each of the leads 802 can be bent and located within a plane parallel to the plane having the bottom encapsulant surface 122 of the encapsulant 106. The end having the first tip 114 is the lowest point of the leads 102.

The bottom component assembly 804 can preferably include a flip chip having a dimensional length and width substantially less than the dimensional length and width of the laminated interposer 136 of the top component assembly 104. The bottom component assembly 804 can be centrally located with and pre-attached to the side of the attachment layer 134 opposite the side attached to the top component assembly 104 resulting in exposed portions of the attachment layer 134 next to the bottom component assembly 804. The combination of both the bottom component assembly 804 and the top component assembly 104 can be mounted over the leads 802 with the exposed portions of the attachment layer 134 next to the bottom component assembly 804.

Connections between circuitry of the bottom component assembly 804 and first surface 806 of the first tier section 810 of the leads 802 using the central interconnects 606 can provide further support of both the bottom component assembly 804 and the top component assembly 104. Connectivity between the laminated interposer 136 of the top component assembly 104 and the leads 802 can be provided using the bond wires 144.

The encapsulant 106 can cover and surround the second tip 116, the bottom component assembly 804, the first tier section 810, the connect area 812, and lower areas 814 between the bottom die paddle 124 and the top component assembly 104. The contacts 140 of the laminated interposer and the a side of the bottom die paddle 124 opposite the side facing the bottom component assembly 804 can be exposed and substantially free of the encapsulant 106.

The cumulative numeric dimensional thickness of the bottom component assembly 804 and the central interconnects 606 can be equivalent in magnitude to the vertical numeric distance between the first surface 806 of the connect area 812 and the first surface 806 of the first tier section 810.

The integrated circuit packaging system 800 can result in a substantially low profile package with provisions for external connectivity with the contacts 140 of the laminated interposer 136 and thermal enhanced capabilities provided by the bottom die paddle 124 exposed on the bottom side of the encapsulant 106.

Figure 9:
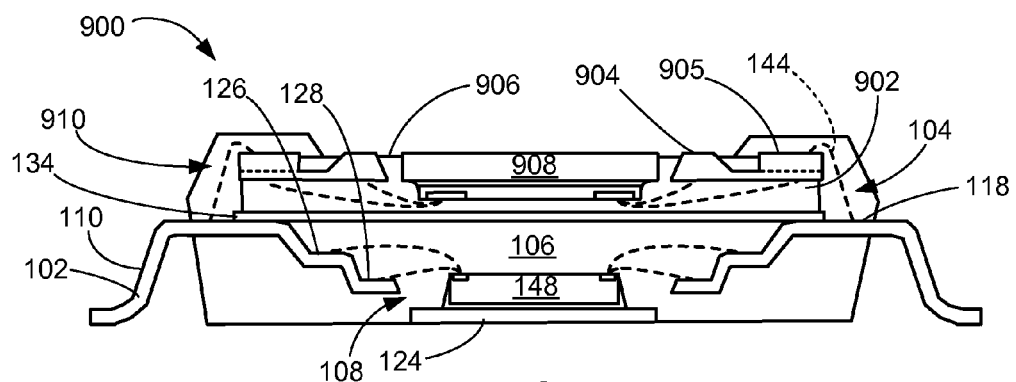
FIG. 9 is a cross-sectional view of an integrated circuit packaging system in a seventh embodiment of the present invention.

Referring now to FIG. 9 therein is shown a cross-sectional view of an integrated circuit packaging system 900 in a seventh embodiment of the present invention. The integrated circuit packaging system 900 is similar to the integrated circuit packaging system 100 of FIG. 1 except for the top component assembly 104 and the connectivity of the device 148 of the bottom component assembly 108 mounted over the bottom die paddle 124. The top component assembly 104 can preferably include a known good unit 902 such as a dual row quad flat no lead, a ball grid array, a land grid array, flip chip, or a wafer level chip scale package.

The device 148 of the bottom component assembly 108 can preferably have connectivity to the first surface 110 of the first tier section 126 or the second tier section 128 of the leads 102. The known good unit 902 includes circuitry having connectivity with contacts 904 or outer contacts 905 such as leads, pads, solder balls or similar types of connection surfaces. The contacts 904 and the outer contacts 905 can preferably be exposed on a contact surface 906. The contacts 904 can preferably surround a top die paddle 908 centrally located and exposed on the contact surface 906. The outer contacts 905 can preferably be located around the perimeter of the contact surface 906 and the contacts can preferably be located between the top die paddle 908 and the outer contacts 905.

A side opposite the contact surface 906 electrically isolated from the circuitry of the known good unit 902 can provide protection to the contents of the known good unit 902 and provide the side with which the attachment layer 134 can preferably be pre-laminated on to for purposes of mounting of the known good unit 902. The attachment layer 134 of the known good unit 902 can preferably be attached on to the first surface 110 of the connect area 118 of the leads 102. The bond wires 144 can be used to provide connectivity between the outer contacts 905 and the first surface 110 of the connect area 118 of the leads 102.

The encapsulant 106 can preferably be applied over the connect area 118, the bond wires 144, and the outer contacts 905 located next to side edges 910 of the known good unit 902. The contacts 904, the top die paddle 908, and adjacent areas of the contact surface 906 located between the contacts 904 and the outer contacts 905 next to the side edges 910 or the top die paddle 908 can be exposed and free of the encapsulant 106.

The contacts 904 can preferably be used to provide connectivity between the integrated circuit packaging system 900 and a next level of integration such as a package, discrete electronic parts, switches, or any combination of similar parts typically accompanying circuitry.

It has been found that the combination of the top die paddle 908 and the bottom die paddle 124 of the integrated circuit packaging system 900 can result in significant improvements in thermal dissipative characteristics yielding higher mean time before failure (MTBF) capabilities with improved performance characteristics in a high circuit density package.

The combined integration of the known good unit 902 with the contacts 904 exposed and mounted over the device 148 of the bottom component assembly 108 of the integrated circuit packaging system 900 having package in package (PIP) characteristics can be used to provide package on package (POP) capabilities in a next level of system integration.

Figure 10:
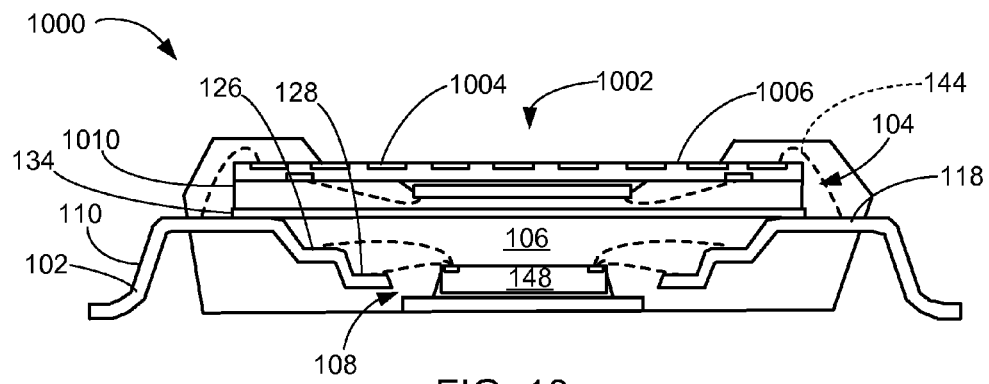
FIG. 10 is a cross-sectional view of an integrated circuit packaging system in an eighth embodiment of the present invention.

Referring now to FIG. 10 therein is shown a cross-sectional view of an integrated circuit packaging system 1000 in an eighth embodiment of the present invention. The integrated circuit packaging system 1000 is similar to the integrated circuit packaging system 100 of FIG. 1 except for the top component assembly 104 and the connectivity of the device 148 of the bottom component assembly 108. The top component assembly 104 can preferably include a land grid array package 1002 known to be defect free. The device 148 of the bottom component assembly 108 can have connectivity to the first surface 110 of the first tier section 126 or the second tier section 128 of the leads 102.

The land grid array package 1002 includes circuitry having connectivity with contacts 1004, such as leads, pads, solder balls, or similar types of connection surfaces, exposed and distributed adjacent a contact surface 1006.

A side opposite the contact surface 1006 of the land grid array package 1002 electrically isolated from the circuitry can provide protection to the contents of the land grid array package 1002 and the side which the attachment layer 134 can be pre-laminated onto for purposes of mounting of the land grid array package 1002. The attachment layer 134 of the land grid array package 1002 can preferably be attached on to the first surface 110 of the connect area 118 of the leads 102. The bond wires 144 can be used to provide connectivity between the contacts 1004 and the first surface 110 of the connect area 118 of the leads 102.

The encapsulant 106 can be applied over the connect area 118, the bond wires 144, and the contacts 1004 located next to side edges 1010 of the land grid array package 1002. The contacts 1004 and the contact surface 1006 located between the contacts 1004 next to the side edges 1010 can be exposed and free of the encapsulant 106. The contacts 1004 located between the contacts 1004 next to the side edges 1010 on opposite ends of the land grid array package 1002 can be used to provide connectivity between the integrated circuit packaging system 900 and a next level of integration such as a package, discrete electronic parts, switches, or any combination of similar parts typically accompanying circuitry.

Figure 11:
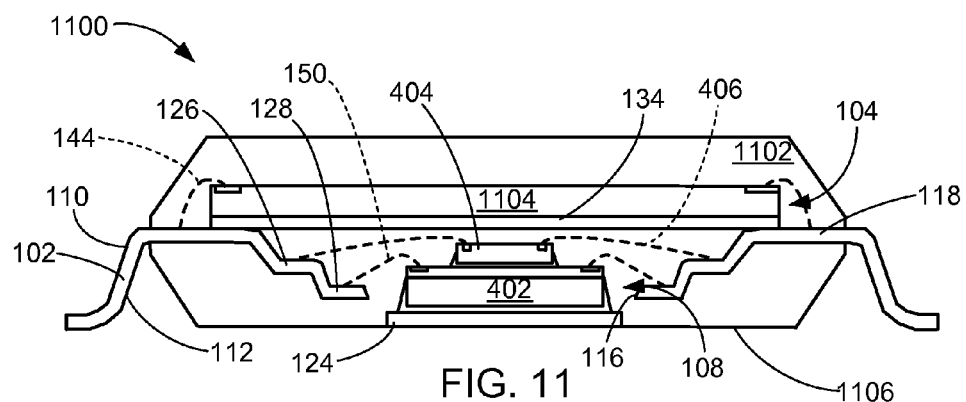
FIG. 11 is a cross-sectional view of an integrated circuit packaging system in a ninth embodiment of the present invention.

Referring now to FIG. 11 therein is shown a cross-sectional view of an integrated circuit packaging system 1100 in a ninth embodiment of the present invention. The integrated circuit packaging system 1100 is similar to the integrated circuit packaging system 100 of FIG. 1 except for the top component assembly 104, the bottom component assembly 108, and an encapsulant 1102.

The bottom component assembly 108 includes the device 402, such as the device 148. The first stack device 404 can be stacked over the bottom component assembly 108. The bottom component assembly 108 can be mounted over the bottom die paddle 124. The device 402 can have connectivity with the first surface 110 of the second tier section 128 and the first stack device 404 can have connectivity with the first surface 110 of the first tier section 126 of the leads 102 using the base interconnects 150 and the bond wires 406 respectively.

The top component assembly 104 can preferably include a second stack device 1104 containing circuitry located over the device 402 and the first stack device 404 of the bottom component assembly 108. The second stack device 1104 can preferably have physical length and width dimensions greater than length and width dimensions of the device 402 and mounted on to the first surface 110 of the connect area 118 using the attachment layer 134. Circuitry of the second stack device 1104 can have connectivity to the first surface 110 of the connect area 118 of the leads 102 using the bond wires 144.

The encapsulant 1102 can be applied over the connect area 118, surround the bond wires 144 and the second stack device 1104 as well as the first stack device 404. The encapsulant 1102 can surround the device 402, the base interconnects 150, the bond wires 406, and the second surface 112 between the connect area 118 and the second tip 116 of the leads 102. The encapsulant 1102 can be applied under the connect area 118 and surround the bottom die paddle 124 with a side of the bottom die paddle 124 substantially exposed adjacent a bottom encapsulant surface 1106.

Figure 12:
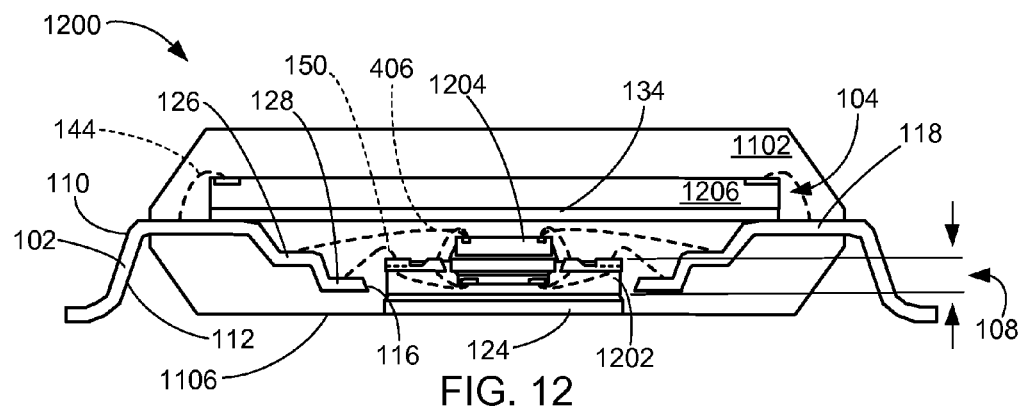
FIG. 12 is a cross-sectional view of an integrated circuit packaging system in a tenth embodiment of the present invention.

Referring now to FIG. 12 therein is shown a cross-sectional view of an integrated circuit packaging system 1200 in a tenth embodiment of the present invention. The integrated circuit packaging system 1200 is similar to the integrated circuit packaging system 100 of FIG. 1 except for the top component assembly 104, the bottom component assembly 108, and the encapsulant 1102.

The bottom component assembly 108 includes a known good package 1202, such as a dual row quad flat no lead package. A stack device 1204, such as the device 148, can preferably be located below the top component assembly 104 mounted over the bottom component assembly 108. The bottom component assembly 108 can be mounted over the bottom die paddle 124. The known good package 1202 of the bottom component assembly 108 can have connectivity with the first surface 110 of the second tier section 128 using the base interconnects 150. The stack device 1204 can have connectivity with the first surface 110 of the first tier section 126 of the leads 102 or direct connectivity with the known good package 1202 of the bottom component assembly 108 using the bond wires 406.

The top component assembly 104 can preferably include a device 1206 containing circuitry located over the bottom component assembly 108. The device 1206 can preferably have physical length and width dimensions greater than the length and width dimensions of the known good package 1202 and mounted on to the first surface 110 of the connect area 118 using the attachment layer 134. Circuitry of the device 1206 can have connectivity to the first surface 110 of the connect area 118 of the leads 102 using the bond wires 144.

The encapsulant 1102 can be applied over the connect area 118, over the bond wires 144, and over the device 1206. The encapsulant 1102 can surround the stack device 1204, the known good package 1202, the base interconnects 150, the bond wires 406, and the second surface 112 between the connect area 118 and the second tip 116 of the leads 102. The encapsulant 1102 can be applied under the connect area 118 and surround the bottom die paddle 124 with a side of the bottom die paddle 124 substantially exposed adjacent the bottom encapsulant surface 1106.

The combined integration of the known good package 1202, the stack device 1204, and the device 1206 within the integrated circuit packaging system 1200 illustrates the present invention configured for package in package (PIP) applications.

Referring now to FIGS. 13A, 13B, 13C, 13D, 13E, and 13F therein are shown cross-sectional plan views of lead and paddle configuration options in an encapsulation phase of integrated circuit packaging systems in an eleventh, twelfth, thirteenth, fourteenth, fifteenth, and sixteenth embodiment of the present invention. For illustrative purposes, the integrated circuit packaging systems 1302, 1314, 1320, 1332, 1344, and 1350 are shown without circuitry, interconnects, wires, or bonding provisions such as a backside coated adhesive, laminated B-stage epoxy material, or other similar mounting materials.

The eleventh, twelfth, thirteenth, fourteenth, fifteenth, and sixteenth embodiments of the present invention illustrate configurations having one specific type of lead. The type of lead implemented are non-restrictive and thus any combination of lead types such as the non-tiered leads 204 of FIG. 2, the leads 102 of FIG. 1, or the leads 802 of FIG. 8 can be implemented in FIGS. 13A, 13B, 13C, 13D, 13E, and 13F.

In an eleventh embodiment of the present invention, the integrated circuit packaging system 1302 is shown having leads 1304, a bottom die paddle 1306, and surrounded by the encapsulant 1102. The leads 1304 include a second surface 1308 and a first tier section 1310 next to a second tip 1312. The second tip 1312 can surround the bottom die paddle 1306 substantially exposed adjacent the bottom encapsulant surface 1106.

A plane containing the second surface 1308 of the first tier section 1310 of each of the leads 1304 can be oriented above and parallel with the plane containing the bottom encapsulant surface 1106.

In a twelfth embodiment of the present invention, the integrated circuit packaging system 1314 is shown having the leads 1304, a bottom die paddle 1316, and surrounded by the encapsulant 1102. The leads 1304 include the second surface 1308 and the first tier section 1310 next to the second tip 1312. The second tip 1312 can surround the bottom die paddle 1306. A plane containing the second surface 1308 of the first tier section 1310 of each of the leads 1304 and a base paddle surface 1318 of the bottom die paddle 1316 can be oriented above and parallel with the plane having the bottom encapsulant surface 1106.

The bottom encapsulant surface 1106 can provide improved environmental protection to the internal contents of the integrated circuit packaging system 1314.

In a thirteenth embodiment of the present invention, the integrated circuit packaging system 1320 is shown having leads 1322, the bottom die paddle 1306, and surrounded by the encapsulant 1102. The leads 1322 include a second surface 1324 and a first tier section 1326 next to a second tip 1328. The second tip 1328 can surround the bottom die paddle 1306 substantially exposed adjacent the bottom encapsulant surface 1106.

The second surface 1324 of the first tier section 1326 of each of the leads 1322 and a base paddle surface 1330 of the bottom die paddle 1306 can be located within a plane having the bottom encapsulant surface 1106. The second surface 1324 of the first tier section 1326 exposed adjacent the bottom encapsulant surface 1106 can be used to provide additional access or connectivity to the integrated circuit packaging system 1320.

In a fourteenth embodiment of the present invention, the integrated circuit packaging system 1332 is shown having leads 1334, the bottom die paddle 1306, and surrounded by the encapsulant 1102. The leads 1334 include a second surface 1336, a first tier section 1338, and a second tier section 1340 next to a second tip 1342. The second tip 1342 can surround the bottom die paddle 1306 substantially exposed adjacent the bottom encapsulant surface 1106.

A plane containing the second surface 1336 of the second tier section 1340 of each of the leads 1334 can be oriented above and parallel with the plane containing the bottom encapsulant surface 1106.

In a fifteenth embodiment of the present invention, the integrated circuit packaging system 1344 is shown having the leads 1334, a bottom die paddle 1346, and surrounded by the encapsulant 1102. The leads 1334 include the second surface 1336, the first tier section 1338, and the second tier section 1340 next to the second tip 1342. The second tip 1342 can surround the bottom die paddle 1306. A plane containing the second surface 1336 of the second tier section 1340 of each of the leads 1334 and a base paddle surface 1348 of the bottom die paddle 1346 can be oriented above and parallel with the plane having the bottom encapsulant surface 1106.

The bottom encapsulant surface 1106 can provide improved environmental protection to the internal contents of the integrated circuit packaging system 1344.

In a sixteenth embodiment of the present invention, the integrated circuit packaging system 1350 is shown having leads 1352, the bottom die paddle 1306, and surrounded by the encapsulant 1102. The leads 1352 include a second surface 1354, a first tier section 1356, and a second tier section 1358 next to a second tip 1360. The second tip 1360 can surround the bottom die paddle 1306 substantially exposed adjacent the bottom encapsulant surface 1106.

The second surface 1354 of the second tier section 1358 of each of the leads 1352 and a base paddle surface 1362 of the bottom die paddle 1306 can be located within a plane having the bottom encapsulant surface 1106. The second surface 1354 of the second tier section 1358 exposed adjacent the bottom encapsulant surface 1106 can be used to provide additional access or connectivity to the integrated circuit packaging system 1350.

Figure 14:
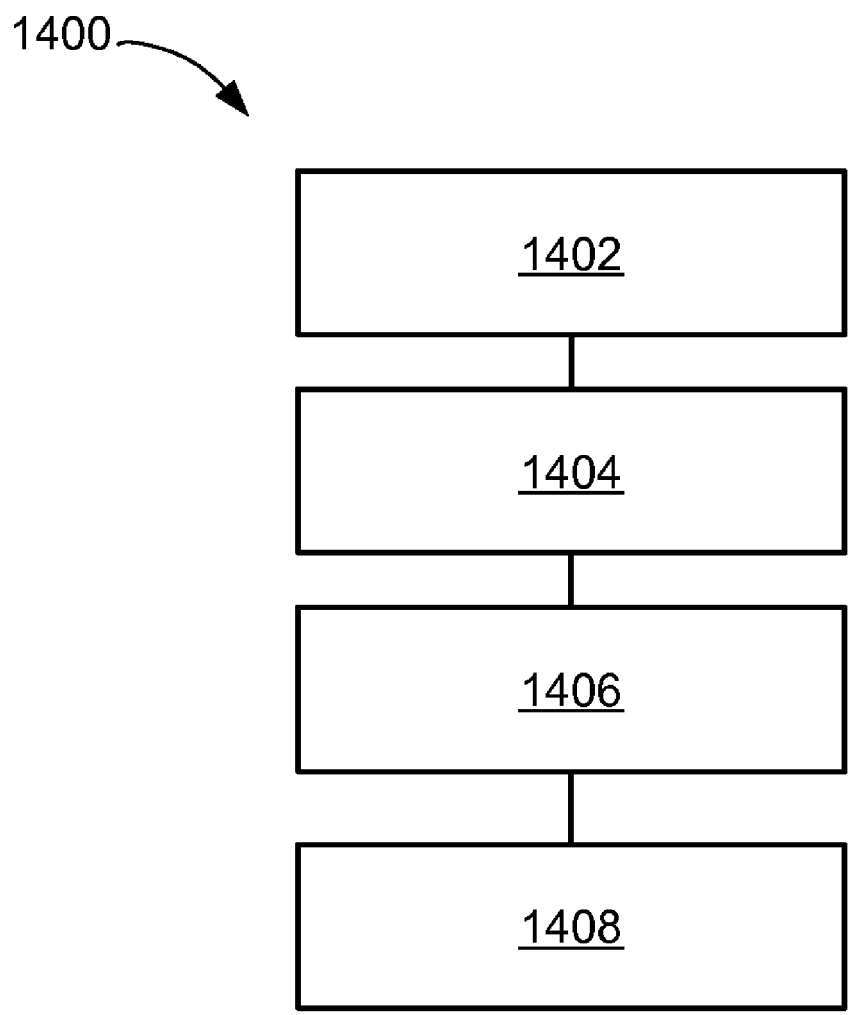
FIG. 14 is a flow chart of a method of manufacture of an integrated circuit packaging system in a further embodiment of the present invention.

Referring now to FIG. 14 therein is shown a flow chart of a method 1400 of manufacture of an integrated circuit packaging system 100 in a further embodiment of the present invention. The method 1400 includes forming a lead to include a first tip at one end, a second tip on the end opposite from the first tip with a connect area between each end located above the first tip, and a first tier section or a second tier section located between the connect area and the second tip in a block 1402; connecting a bottom component assembly to the first tier section or the second tier section in a block 1404; connecting a top component assembly over the connect area in a block 1406; and applying an encapsulant over and under the connect area with the first tip exposed in a block 1408.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package on package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   forming a lead to include a first tip at one end, a second tip on an end opposite from the first tip with a connect area between each end located above the first tip, and a first tier section or a second tier section, located between the connect area and the second tip;
   connecting a bottom component assembly to the first tier section or the second tier section;
   connecting a top component assembly over the connect area, the top component assembly having a laminated interposer with a contact; and
   applying an encapsulant over and under the connect area with the first tip exposed.

2. The method as claimed in claim 1 wherein:
   connecting the top component assembly, having a known good unit with a contact next to a top die paddle, over the connect area; and
further comprising:
   mounting a bottom die paddle below the bottom component assembly.

3. The method as claimed in claim 1 wherein:
   connecting the bottom component assembly, having a known good package, to the second tier section;
   connecting the top component assembly, having a device, over the connect area; and
further comprising:
   mounting a stack device over the bottom component assembly.

4. The method as claimed in claim 1 further comprising:
   connecting a central device to the first tier section; and
wherein:
   connecting the top component assembly over the central device, over the connect area, and physically isolated from the lead.

5. A method of manufacture of an integrated circuit packaging system comprising:
   forming a lead with a first surface and a second surface to include a first tip at one end, a second tip on an end opposite from the first tip with a connect area between each end located above the first tip and above or next to the second tip, and a first tier section or a second tier section below the first tier section, located between the connect area and the second tip with the first tier section closest to the connect area;
   connecting a bottom component assembly to the first surface of the first tier section or the second tier section;
   connecting a top component assembly over the first surface of the connect area, the top component assembly having a laminated interposer with a contact exposed adjacent a contact surface; and
   applying an encapsulant over and under the connect area with the first tip, the contact, and the contact surface adjacent the contact, and portions of the first surface and the second surface of the connect area exposed.

6. The method as claimed in claim 5 wherein:
   connecting the top component assembly, having a known good unit with a contact next to a top die paddle exposed adjacent a contact surface, over the connect area;
   applying the encapsulant with the contact next to the top die paddle, the top die paddle, and the contact surface adjacent the contact exposed; and
further comprising:
   mounting a bottom die paddle having a side exposed of the encapsulant below the bottom component assembly.

7. The method as claimed in claim 5 wherein:
   connecting the bottom component assembly, having a known good package, to the first surface of the second tier section;
   connecting the top component assembly, having a device, over the first surface of the connect area; and
further comprising:
   mounting a stack device between the top component assembly and the bottom component assembly.

8. The method as claimed in claim 5 further comprising:
   connecting a central device to the first surface of the first tier section; and
wherein:
   connecting the top component assembly over the central device with the top component assembly physically isolated from the connect area of the lead.

9. An integrated circuit packaging system comprising:
   a lead formed to include a first tip at one end, a second tip on an end opposite from the first tip with a connect area between each end located above the first tip, and a first tier section or a second tier section, located between the connect area and the second tip;
   a bottom component assembly connected to the first tier section or the second tier section;
   a top component assembly connected over the connect area, the top component assembly having a laminated interposer with a contact; and
   an encapsulant applied over and under the connect area with the first tip exposed.

10. The system as claimed in claim 9 wherein:
    the top component assembly, having a known good unit with a contact next to a top die paddle, connected over the connect area; and
further comprising:
    a bottom die paddle mounted below the bottom component assembly.

11. The system as claimed in claim 9 wherein:
    the bottom component assembly, having a known good package, connected to the second tier section;
    the top component assembly, having a device, connected over the connect area; and
further comprising:
    a stack device mounted the bottom component assembly.

12. The system as claimed in claim 9 further comprising:
    a central device connected to the first tier section; and
wherein:
    the top component assembly connected over the central device, over the connect area, and physically isolated from the lead.

13. The system as claimed in claim 9 wherein:
    the lead with a first surface and a second surface formed to include the first tip at one end, the second tip on the end opposite from the first tip with the connect area between each end located above the first tip and above or next to the second tip, and the first tier section or the second tier section below the first tier section located between the connect area and the second tip with the first tier section closest to the connect area;
    the bottom component assembly connected to the first surface of the first tier section or the second tier section;
    the top component assembly connected over first surface of the connect area; and
    the encapsulant applied over and under the connect area with the first tip and portions of the first surface and the second surface of the connect area exposed.

14. The system as claimed in claim 13 wherein:
 the top component assembly, having a laminated interposer with a contact exposed adjacent a contact surface, connected over the connect area; and
 the encapsulant applied over and under the connect area with the first tip, the contact, and the contact surface adjacent the contact.

15. The system as claimed in claim 13 wherein:
 the top component assembly, having a known good unit with a contact next to a top die paddle exposed adjacent a contact surface, connected over the connect area;
 the encapsulant applied with the contact next to the top die paddle, the top die paddle, and the contact surface adjacent the contact exposed; and
further comprising:
 a bottom die paddle having a side exposed of the encapsulant mounted below the bottom component assembly.

16. The system as claimed in claim 13 wherein:
 the bottom component assembly, having a known good package, connected to the first surface of the second tier section;
 the top component assembly, having a device, connected over the first surface of the connect area; and
further comprising:
 a stack device mounted between the top component assembly and the bottom component assembly.

17. The system as claimed in claim 13 further comprising:
 a central device connected to the first surface of the first tier section; and
wherein:
 the top component assembly connected over the central device with the top component assembly physically isolated from the connect area of the lead.

* * * * *